United States Patent
Tanimoto

(10) Patent No.: US 7,508,014 B2
(45) Date of Patent: Mar. 24, 2009

(54) FIELD EFFECT TRANSISTOR INCLUDING A GATE ELECTRODE AND AN ADDITIONAL ELECTRODE

(75) Inventor: Masashi Tanimoto, Anan (JP)

(73) Assignee: Nichia Corporation, Tokushima (JP)

( * ) Notice: Subject to any disclaimer, the term of this patent is extended or adjusted under 35 U.S.C. 154(b) by 126 days.

(21) Appl. No.: 11/274,307

(22) Filed: Nov. 16, 2005

(65) Prior Publication Data
US 2006/0108602 A1 May 25, 2006

(30) Foreign Application Priority Data
Nov. 19, 2004 (JP) .............................. 2004-336516
Nov. 14, 2005 (JP) .............................. 2005-329267

(51) Int. Cl.
| | |
|---|---|
| H01L 31/0328 | (2006.01) |
| H01L 31/0336 | (2006.01) |
| H01L 31/072 | (2006.01) |
| H01L 31/109 | (2006.01) |
| H01L 29/739 | (2006.01) |
| H01L 29/06 | (2006.01) |
| H01L 29/04 | (2006.01) |
| H01L 29/15 | (2006.01) |
| H01L 29/47 | (2006.01) |
| H01L 29/812 | (2006.01) |
| H01L 29/24 | (2006.01) |
| H01L 33/00 | (2006.01) |

(52) U.S. Cl. .......................... 257/192; 257/20; 257/24; 257/27; 257/73; 257/103; 257/187; 257/189; 257/194; 257/195; 257/196; 257/200; 257/201; 257/E29.246; 257/E29.247; 257/E29.248; 257/E29.249; 257/E29.25; 257/E29.251; 257/E27.252; 257/E29.253; 257/E29.254

(58) Field of Classification Search .................. 257/20, 257/24, 103, 192, 200–201, 194–195, 27, 257/73, 187, 189, 196, E29.246–E29.254
See application file for complete search history.

(56) References Cited

U.S. PATENT DOCUMENTS 4,616,242 A * 10/1986 Solomon et al. ............ 257/195

(Continued)

FOREIGN PATENT DOCUMENTS

JP          2-148739          6/1990

(Continued)

OTHER PUBLICATIONS

European Search Report issued Mar. 19, 2008, in the European Application 05-292446.

(Continued)

*Primary Examiner*—Ida M Soward
(74) *Attorney, Agent, or Firm*—Wenderoth, Lind & Ponack, L.L.P.

(57) ABSTRACT

A field effect transistor including an i-type first semiconductor layer and a second semiconductor layer formed on the first semiconductor layer and having a band gap energy higher in magnitude than that of the first semiconductor layer. The first semiconductor layer and second semiconductor layer are each made of a gallium nitride-based compound semiconductor layer. A gate electrode is formed on the second semiconductor layer and a second electrode is formed on the first semiconductor layer. Thus, the field effect transistor is constructed in such a manner as the first semiconductor layer and second semiconductor layer are interposed between the gate electrode and the second electrode. Thus field effect transistor is able to discharge the holes that are accumulated in the channel from the elemental structure and to improve the withstand voltage of the field effect transistor.

14 Claims, 8 Drawing Sheets

U.S. PATENT DOCUMENTS

| | | | | |
|---|---|---|---|---|
| 4,698,654 | A * | 10/1987 | Kohn | 257/260 |
| 4,806,998 | A * | 2/1989 | Vinter et al. | 257/192 |
| 4,821,093 | A * | 4/1989 | Iafrate et al. | 257/194 |
| 5,172,194 | A * | 12/1992 | Chang | 257/26 |
| 5,285,514 | A * | 2/1994 | Nojiri et al. | 385/131 |
| 5,359,220 | A * | 10/1994 | Larson et al. | 257/378 |
| 5,399,887 | A * | 3/1995 | Weitzel et al. | 257/194 |
| 5,686,735 | A * | 11/1997 | Sim | 257/24 |
| 5,705,842 | A * | 1/1998 | Kitamura et al. | 257/362 |
| 5,821,599 | A * | 10/1998 | Rupp | 257/467 |
| 5,825,049 | A * | 10/1998 | Simmons et al. | 257/25 |
| 6,043,517 | A * | 3/2000 | Presting et al. | 257/184 |
| 6,043,518 | A * | 3/2000 | Hsu et al. | 257/192 |
| 6,376,866 | B1 * | 4/2002 | Shakuda | 257/103 |
| 6,396,085 | B1 * | 5/2002 | Yoshida | 257/135 |
| 6,476,431 | B1 * | 11/2002 | Ohno et al. | 257/280 |
| 6,670,687 | B2 * | 12/2003 | Satoh et al. | 257/471 |
| 7,078,743 | B2 * | 7/2006 | Murata et al. | 257/192 |
| 7,211,839 | B2 * | 5/2007 | Kachi et al. | 257/194 |
| 2001/0048117 | A1 * | 12/2001 | Uemura | 257/189 |
| 2003/0178672 | A1 * | 9/2003 | Hatakeyama et al. | 257/328 |
| 2004/0155261 | A1 * | 8/2004 | Anda et al. | 257/194 |
| 2005/0029558 | A1 * | 2/2005 | Hatakeyama et al. | 257/264 |
| 2005/0285109 | A1 * | 12/2005 | Kim | 257/59 |
| 2006/0138457 | A1 * | 6/2006 | Otsuka et al. | 257/194 |
| 2006/0157733 | A1 * | 7/2006 | Lucovsky et al. | 257/192 |
| 2007/0023750 | A1 * | 2/2007 | Chiang et al. | 257/43 |

FOREIGN PATENT DOCUMENTS

| | | |
|---|---|---|
| JP | 2001-168111 | 6/2001 |
| JP | 2003-297856 | 10/2003 |
| JP | 2004-319552 | 11/2004 |
| WO | 2004/068590 | 8/2004 |

OTHER PUBLICATIONS

Kotaro Tsubaka et al., "Coherence length in quantum interference devices having periodic potential," Applied Physics Letters, AIP, American Institute of Physics, Sep. 5, 1988, US vol. 53, No. 10.

N. Wichmann et al., "InAlAs/InGaAs Double-Gate HEMTs With High Extrinsic Transconductance", International Conference on Indium Phoshide and Related Materials, Conference Proceedings, 16th IPRM, May 31-June 4th, pp. 295-298.

* cited by examiner

FIELD EFFECT TRANSISTOR INCLUDING A GATE ELECTRODE AND AN ADDITIONAL ELECTRODE

BACKGROUND OF THE INVENTION

1. Field of the Invention

The present invention relates to a field effect transistor that uses gallium nitride-based compound semiconductor.

2. Description of the Related Art

Since a gallium nitride-based compound semiconductor is wide in the forbidden band, a field effect transistor (FET) using that semiconductor is capable of being operated at a high frequency and at a high withstand voltage. So, it is expected as a high-output power semiconductor device. And there have up to now been proposed a metal semiconductor FET (MESFET), a high electron mobility transistor (HEMT), and so on. The HEMT is a high-speed semiconductor device which has become popular as the devices operating at a high frequency. Specifically, regarding this, a device that uses a GaAs/AlGaAs heterojunction has been put to practical use. Because of its excellent microwave/millimeter wave characteristics, that device has widely been used as a low-noise high-speed field effect transistor for, for example, satellite broadcasting receiver (refer to, for example, Japanese Patent Application Laid-Open No. 2003-297856).

In the recent years, attention has been drawn toward the HEMT which uses a GaN compound (hereinafter referred to as the GaN-based HEMT) in place of a GaAs compound as the next generation high-speed type FET. The GaN compound is wide in band gap and also the saturation electron mobility, which is estimated from the effective mass of electron, is high. Thus, the possibility exists of realizing a high frequency device that provides a high output and that can operate at a high withstand voltage and at a high temperature. Because of this, extensive studies of this HEMT and researches have been made. An example of the HEMT structure which uses a GaN compound is illustrated in FIG. 1. The GaN-based HEMT illustrated in this figure includes an insulating sapphire substrate 11, on which there are sequentially laminated an AlN buffer layer 12, an undoped GaN layer 13 acting as an electron transit layer, and an n-type AlGaN layer 14 acting as a carrier supply layer. Also, on an upper surface of the n-type AlGaN layer 14 there are formed a source electrode 15, a gate electrode 16, and a drain electrode 17. In this structure of HEMT, the n-type AlGaN layer 14 acting as the carrier supply layer supplies electrons to the undoped GaN layer 13 acting as the electron transit layer, and the electrons that have been supplied transit, with a high mobility, at an uppermost portion of the GaN layer 13, using as a channel a region 13a contacting with the n-type AlGaN layer 14.

In order to increase the output of the above-described HEMT, there is the need to make it high in withstand voltage so that it can be applied with a high voltage. However, when a high magnitude of voltage is applied between the source electrode 15 and the drain electrode 17, the speed of the electron E transiting at or through the channel region 13a increases to collide with the relevant lattices. Due to these collisions, collision ionization occurs creating new collision-ionized electrons E' and holes h. The produced carriers, one after another, are repeatedly collision ionized, resulting in that normal FET operations become unable to occur. The problem regarding the collision ionization is that the holes that have been produced are stored in the electron transit layer. That is, of the ionization electrons and holes that have been produced, the electrons are used as electric current and have no problems with storage. However, since the holes are not contributed as electric current, positive electric charges are stored at a lower part of the channel. The positive electric charges that have been stored cause the induction of negative electric charges toward them and, by doing so, draw a larger number of electrons toward them. As a result of this, collision ionization is promoted, which results in a larger number of holes being stored and causing a rapid increase in the electric current. This goes beyond the limit of the withstand voltage of the device to cause breakdown of it.

For the purpose of preventing the above-described drawback, a structure has been proposed which is disclosed in Japanese Patent Application Laid-Open No. 2001-168111. This structure, as illustrated in FIG. 2A, is made into a construction wherein a p-type GaN layer 28 is formed under a channel 23 of an undoped GaN layer, and, by doing so, the channel 23 is interposed between the p-type GaN layer 28 and the undoped AlGaN layer 24 and a gate electrode 26. As a result of this, the holes that have been produced due to the collision ionization when having passed an electric current between a source electrode 25 and a drain electrode 27 become able to be drawn out of the device via the electrode 29 formed on the p-type GaN layer 28. In this way, it is possible to increase the withstand voltage.

However, to realize this construction, there exist very difficult problems to solve. In order to manufacture a GaN-based HEMT of the structure of FIG. 2A, as illustrated in FIG. 2B, it is necessary to form the p-type GaN layer 28 on a substrate 21 through a buffer layer 22. An example of known methods to make the GaN layer p-type is annealing treatment in which the GaN layer doped with p-type impurity such as Mg is heated to remove hydrogen. However, it is not easy to make hydrogen removal, in a structure wherein on the Mg doped GaN layer grown on a sapphire substrate there are further laminated layers, to such an extent, by annealing treatment, as the Mg-doped GaN layer which is located under exhibits a p-type one. In addition, since forming the p-type GaN layer results in forming a large capacitance over an entire surface of p-type layer, there is also the problem that it becomes difficult to make the device operation higher in speed. Further, since, regarding the p-type layer, there is the need to dope a large amount of impurity, the crystallinity of the p-type layer tends to be very bad. This is a problem that is peculiar to a gallium nitride-based compound semiconductor. Accordingly, when providing a p-type layer on the substrate side of the channel, the crystallinity per se of respective layers formed on the p-type layer (whose crystallinity is inferior) becomes deteriorated. This results in the characteristics of the device being deteriorated.

Also, when applying a voltage to the HEMT of the electrode structure such as that illustrated in FIG. 1, an electric field which is higher than the electric field applied in the other part is inconveniently applied at the drain terminal of the gate electrode. When a high voltage is applied to the field effect transistor device and as a result a local field intensity exceeds a specified value, the above-described breakdown of the device takes place at that place. So, to increase the withstand voltage of the device, it is important to avoid the localized electric field.

SUMMARY OF THE INVENTION

The present invention has been made in order to solve the above-described problems in the prior art. A main object of the present invention is to provide a field effect transistor in which conversion into a high withstand voltage is realized to cause a high level of output to be obtained and to provide a method of manufacturing the same.

To attain the above object, a field effect transistor according to a first aspect of the present invention comprises an i-type first semiconductor layer and a second semiconductor layer formed on the first semiconductor layer and having a band gap energy greater than that of the first semiconductor layer. In this field effect transistor, the first semiconductor layer and second semiconductor layer are each made of a gallium nitride-based compound semiconductor layer, a gate electrode is formed on the second semiconductor layer, a second electrode is formed on the first semiconductor layer, and the first semiconductor layer and second semiconductor layer are interposed between the gate electrode and the second electrode. By using this construction, the holes stored in the channel become able to be discharged from the relevant element, so that it is possible to enhance the withstand voltage of the field effect transistor.

Also, the field effect transistor according to a second aspect of the present invention is formed so that the second electrode is formed in such a manner as to cover a part of the first semiconductor layer. As a result of this construction, since the second electrode clads only a part of the first semiconductor layer, it is possible to suppress the capacitance component produced due to the existence of the second electrode, so that it is possible to maintain the operation speed of the field effect transistor as is.

Further, in the field effect transistor according to a third aspect of the present invention, the second semiconductor layer has an AlGaN layer and the first semiconductor layer has a GaN layer.

Further, also, in the field effect transistor according to a fourth aspect of the present invention, the first semiconductor layer is a carrier transit layer and the second semiconductor layer is a carrier supply layer.

Further, also, the field effect transistor according to a fifth aspect of the present invention is constructed in the way in which the field effect transistor is an HEMT.

Further, also, the field effect transistor according to a sixth aspect of the present invention includes a carrier transit layer and a carrier supply layer formed on the carrier transit layer and having a band gap energy greater than that of the carrier transit layer. In this field effect transistor, each of the carrier transit layer and carrier supply layer is made of a gallium nitride-based compound semiconductor layer, a gate electrode, source electrode, and drain electrode are formed on the carrier supply layer, a second electrode formed on at least a part of the carrier transit layer, and the carrier transit layer and carrier supply layer are interposed between the gate electrode and the second electrode. By doing so, the structure is constructed in the way in which the carrier transit layer and carrier supply layer are interposed between the gate electrode and the second electrode, so that it is possible to discharge the holes stored in the channel from the device and to enhance the withstand voltage of the field effect transistor.

Further, also, the field effect transistor according to a seventh aspect of the present invention has the second electrode formed at a position that substantially opposes that at which the gate electrode was formed. With this construction, the hole-exhaustion effect is further enhanced, so that further increase in the withstand voltage of the field effect transistor can be achieved. Incidentally, the gate electrode, source electrode, and drain electrode can be formed on the first surface side of the carrier supply layer. On the other hand, the second electrode can be formed on the second surface side opposing the first surface of the carrier transit layer, namely on a surface side different from the formation surface where the source electrode or/and drain electrode are formed.

Further, also, the field effect transistor according to an eighth aspect of the present invention is the one that has a channel consisting of a nitride-based compound semiconductor and includes a source electrode, gate electrode, and drain electrode. The gate electrode and the second electrode are formed opposing each other with the channel between the gate electrode and the second electrode, and the second electrode is provided on a nitride-based compound semiconductor having the channel.

Further, also, in the field effect transistor according to a ninth aspect of the present invention, the second electrode discharges a carrier of a conductivity type different from that of a carrier injected from the source electrode.

Further, also, in the field effect transistor according to a tenth aspect of the present invention, the second electrode is subjected to Schottky junction.

Further, also, the field effect transistor according to an eleventh aspect of the present invention has a laminate structure of a nitride-based compound semiconductor having the channel, and the source electrode, gate electrode, drain electrode, and second electrode are provided on a surface of the laminate structure, each having an external connecting portion that extends outside from the laminate structure.

Further, also, in the field effect transistor according to a twelfth aspect of the present invention, a center portion in widthwise direction of the second electrode is displaced in a direction in which the carriers of the channel transit, with respect to the center portion of a center portion in widthwise direction of the gate electrode.

Further, also, the field effect transistor according to a thirteenth aspect of the present invention is an HEMT having a heterojunction of a nitride-based compound semiconductor between the channel and the gate electrode.

Also, a method of manufacturing a field effect transistor according to a fourteenth aspect of the present invention is the one the field effect transistor of that has provided on its nitride-based compound semiconductor elemental-structure the source electrode, gate electrode, and drain electrode. This method includes a step of laminating a nitride-based compound semiconductor on a growth substrate and forming a elemental structure having a carrier transit layer, a primary electrode forming step of forming an electrode on the elemental structure, an adhesion step of making contact adhesion of a support substrate to the primary electrode forming surface side of the elemental structure, and a secondary electrode forming step of forming an electrode on that surface side of the elemental structure that opposes the support substrate. In this method, one of the primary and secondary electrodes is a gate electrode and the other is a second electrode, and this second electrode is formed on the carrier transit layer. According to another aspect of a method of manufacturing a field effect transistor, the field effect transistor is produced to have a carrier transit layer, and a carrier supply layer that is formed on the carrier transit layer and the band gap energy of that is higher in magnitude than that of the carrier transit layer. Further, this method includes a step in which there are sequentially laminated, on a growth substrate, if necessary, the carrier transit layer having a buffer layer and a GaN layer, and the carrier supply layer having an AlGaN layer, a step in which the gate electrode is formed on the carrier supply layer, a step in which there are removed the growth substrate and, if necessary, the buffer layer, and a step in which the second electrode is formed on at least a part of the carrier transit layer. As a result of this, it is possible to discharge the holes stored in the channel from the device and to enhance the withstand voltage of the field effect transistor. Also, by forming the gate electrode and second electrode opposing in such a way as to interpose the carrier transit layer between these two electrodes in the steps before and after the step of adhesion onto the support substrate, respectively, it is possible to obtain an electrode structure the electrodes of that suitably oppose each other in such a way as to interpose the elemental structure.

Also, a method of manufacturing a field effect transistor according to a fifteenth aspect of the present invention includes a step in which, after the contact adhesion step, at least a part of the growth substrate is removed so as to cause exposure of at least a part of the elemental structure, and, in the secondary electrode forming step, an electrode is provided on the exposed portion of the elemental structure.

Also, a method of manufacturing a field effect transistor according to a sixteenth aspect of the present invention includes a film thinning step in which, after the exposure step, a part of the exposed portion of the elemental structure is removed to make the relevant film thin. By executing these steps, it is possible to form the secondary electrode in the exposed part, namely it is possible to make the secondary electrode the one that is located at a desired within-plane position of the elemental structure, and, at a suitable depth of position of that elemental structure. As a result of this, it is possible to provide a suitable transistor structure.

Also, a method of a manufacturing field effect transistor according to a seventeenth aspect of the present invention includes an electrode exposure step in which, after the exposure step, a part of the elemental structure is removed to cause exposure of a part of the primary electrode.

Also, a method of manufacturing a field effect transistor according to an eighteenth aspect of the present invention is a method of manufacturing a field effect transistor that is characterized by including a step of electrically connecting the secondary electrode and the exposed portion of the primary electrode, in the exposed surface of the primary electrode, so as to electrically connect either the source electrode or gate electrode with the second electrode. With this method, either the source electrode or gate electrode, and second electrode that oppose each other with the elemental structure being interposed between these two electrodes are wired on the exposed surface of the primary electrode, or the secondary electrode is connected to at least a part of the portion of external connection of the primary electrode, in such a manner as that secondary electrode overlaps. By doing so, it is possible to easily produce a bi-electrode connection circuit with use of the gate electrode and the second electrode.

Also, with a method of manufacturing a field effect transistor according to a nineteenth aspect of the present invention, in the primary electrode forming step, the gate electrode is formed, and, in the secondary electrode forming step, the second electrode is formed.

Also, with a method of manufacturing a field effect transistor according to a twentieth aspect of the present invention, in the primary electrode forming step, a source electrode and a drain electrode are formed.

Also, with a method of manufacturing a field effect transistor according to a twenty-first aspect of the present invention, in the electrode exposing step, at least three side surfaces facing different directions are formed on the elemental structure within the exposed surface of the primary electrode, and external connecting portions of the gate electrode, source electrode, and drain electrode are exposed from the at least three side surfaces.

Also, in a method of manufacturing a field effect transistor according to the twenty-second aspect of the present invention, the support substrate is electrically conductive, and the source electrode is electrically connected to the support substrate in the adhesion step.

According to a field effect transistor and a method of manufacturing it according to the present invention, the holes that have occurred from the first semiconductor layer can be discharged from the second electrode with a high efficiency. Accordingly, the field effect transistor can be made the one that avoids the breakdown of the device due to the storage of the hole and that can have higher withstand voltage and can provide, i.e., comply with, a high output.

The above and further objects and features of the invention will more fully be apparent from the following detailed description with accompanying drawings.

DETAILED DESCRIPTION OF THE PREFERRED EMBODIMENTS

Figure 3:
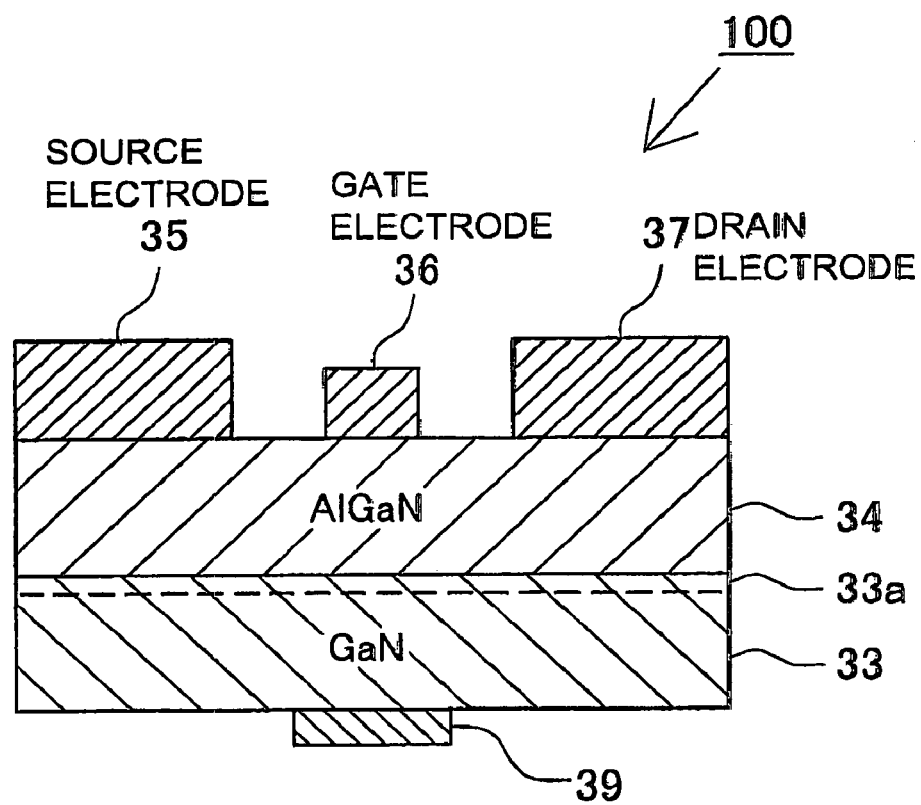
FIG. 3 is a schematic sectional view illustrating an example of a field effect transistor according to an embodiment of the present invention.

FIG. 3 illustrates an example constructing a GaN-based HEMT 100, as the field effect transistor according to an embodiment of the present invention. The HEMT 100 illustrated in this figure has a construction in which a carrier transit layer 33 as a first semiconductor layer and a carrier supply layer 34 as a second semiconductor layer are sequentially laminated. On an upper surface of the carrier supply layer 34, there are formed a source electrode 35, gate electrode 36, and drain electrode 37. In this embodiment, a monopolar device that uses electrons as the carriers will be explained. However, in a case where using holes prepared by making the conductivity type of the carriers opposite, the device can be made a transistor using the holes. Namely, in such a device, the carriers of a conductivity opposite to that of the carriers, i.e., electrons are discharged via the second electrode. In this structure of GaN-based HEMT 100, the carrier supply layer 34 supplies electrons to the carrier transit layer 33. The electrons that have been supplied transits through a channel 33a formed at an upper portion of the carrier transit layer 33 close to the carrier supply layer 34, with a high mobility. In this way, in a case where the carriers are mainly electrons, the carrier transits layer 33 that is a semiconductor layer having the channel 33a acts as the electron transit layer. The semiconductor layer having the channel 33a referred to here in this specification means a layer that is physically substantially the same as the channel 33a. The dimension of the channel 33a is controlled by the depletion layer that is formed by the gate voltage applied to the gate electrode 36. In this example, as the carrier transit layer 33 there is used an undoped GaN layer and as the carrier supply layer 34 there is used the n-type AlGaN layer. Although in this carrier supply layer a dopant is doped for increasing the carrier density, it is also possible, by reducing the amount of impurity doped, or by making the layer an undoped one, to decrease the gate leak current and make the withstand voltage high. On the other hand, in the carrier transit layer, it may be doped with a suitable dopant, so as to decrease the transit of the carriers in the carrier transit layer 33 other than the channel 33a. In a case of doping with an n-type impurity into the carrier transit layer 33 (e.g., in the case of the n-type or n$^+$-type) it might happen that due to the formation of the capacitance unexpected electric current will flow at the time of switch-off. Thus, an n$^-$-type one is preferable. In this way, the off characteristic can be controlled depending on the carrier concentration of the carrier layer 33. Also, in the case of a normally-off type, using an i-type layer, for example, an undoped layer as the carrier transit layer 33 is preferable. On the other hand, regarding the nitride-based compound semiconductor, since when forming the nitride-based compound semiconductor it is likely to have an n-type conductivity due to the vacancy of nitrogen, doping a p-type impurity to such an extent as to compensate for that vacancy also is possible. Also, although in FIG. 3 the thickness of the AlGaN layer and that of GaN layer are similar, in an actual field effect transistor the GaN layer is greater in thickness than the AlGaN layer.

Of the respective electrodes formed on the upper surface of the carrier supply layer 34, the source electrode and drain electrode each are ohmic electrodes, and the gate electrode is a Schottky electrode. With respect to each of these electrodes, although not illustrated, it is also possible to interpose a contact layer for obtaining the ohmic junction characteristic and Schottky junction characteristic. For example, the source electrode and drain electrode construct ohmic electrodes at the interface with the ohmic contact layer formed on the carrier supply layer, while the gate electrode has a Schottky junction characteristic at the interface contacting with the Schottky contact layer formed on the carrier supply layer.

Figure 4:
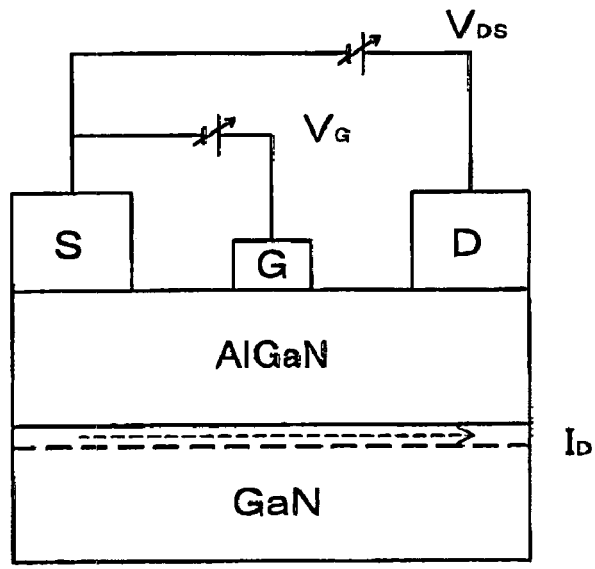
FIG. 4 is a schematic sectional view illustrating the field effect transistor of FIG. 3 to which an inter-drain-source voltage $V_{DS}$ is applied and, by doing so, illustration is made of a state wherein a drain current $I_D$ flows.
Figure 5:
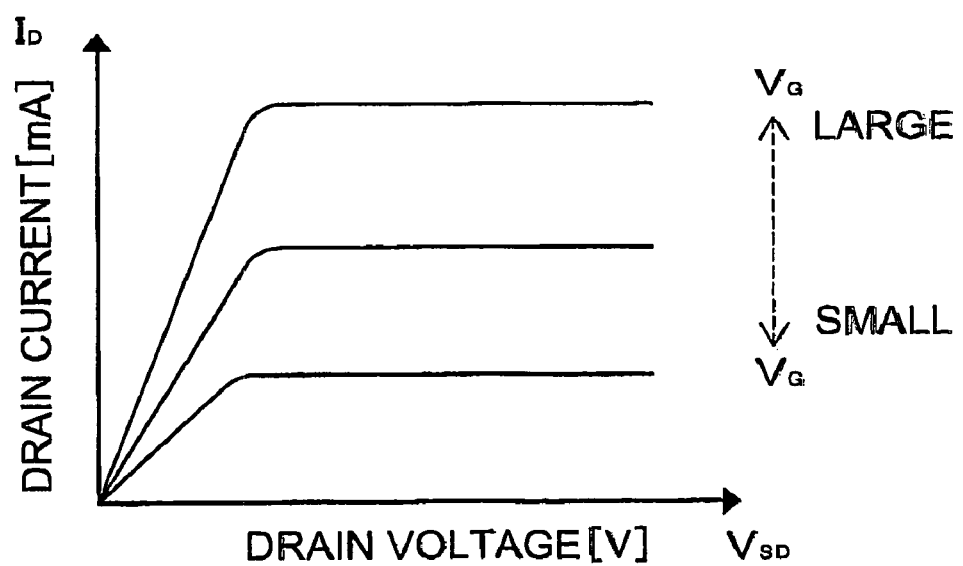
FIG. 5 is a graphic diagram illustrating a state wherein the drain current $I_D$ flowing depending on the inter-drain-source voltage $V_{DS}$ is controlled by applying a gate voltage $V_G$.

In the field effect transistor, electrons serving as the carriers are emitted from the donors within the carrier supply layer. However, these carrier electrons would rather be drawn into the channel whose affinity with electrons is higher, than be kept staying within the carrier supply layers. By doing so, the carrier electrons are stored in the proximity of the interface. These electrons that have been stored, because they are not scattered by the dopant, can transit through the channel with a high mobility. On the other hand, as illustrated in FIG. 4, when applying the inter-drain-source voltage $V_{DS}$ between the source electrode and drain electrode, the drain electrode $I_D$ flows between the source electrode and drain electrode through the channel. Also, when applying the gate voltage $V_G$ to the gate electrode, according to that voltage there is extended the depletion layer occurring under the gate electrode. Accordingly, as illustrated in FIG. 5, the drain current $I_D$ can be controlled by the gate voltage $V_G$. Also, the Schottky contact layer right beneath the gate electrode acts as a barrier layer for suppressing the electric current (gate leak current) flowing between the gate electrode and the channel. On the other hand, the ohmic contact layers act to decrease those contact resistances of the source electrode and drain electrode which have been deemed as the ohmic electrodes.

Further, on the underside of the carrier transit layer 33 there is formed the second electrode 39. As a result of this, it is possible to draw off the holes h, having occurred due to the collision ionization, to outside the field effect transistor device via the second electrode 39. As a result of the fact that the accumulation of the holes is avoided, the avalanche effect that leads to the breakdown of the device is avoided, and thus the enhancement in the withstand voltage of the device is realized. The second electrode 39 doesn't need to be formed over the whole of the underside of the carrier transit layer 33. The discharge of the holes becomes possible simply by locally providing the second electrode 39 at an arbitrary position. On the other hand, the second electrode 39 may be formed over the whole of the underside of the carrier transit layer 33 or channel 33a, or alternatively, a structure wherein the electrode is provided on the substrate using a conductive substrate may be made. By making small the area of the second electrode 39, it is possible to decrease the capacitance.

Figure 1:
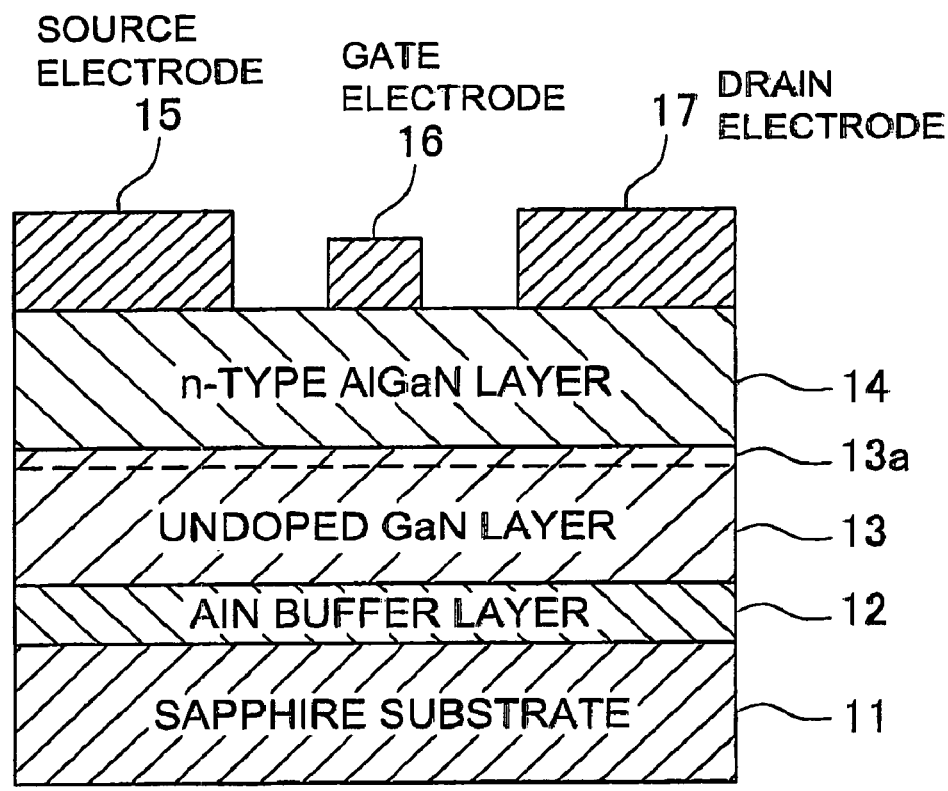
FIG. 1 is a schematic sectional view illustrating an example of a conventional HEMT structure that stands on the use of a GaN compound.
Figure 2A:
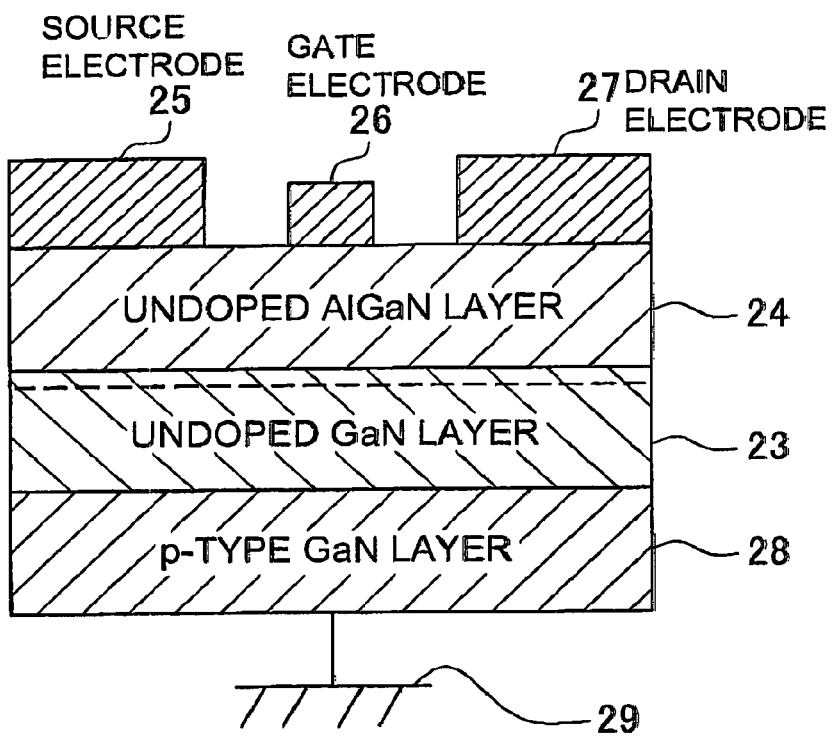
FIGS. 2A and 2B are schematic sectional views illustrating an example of another conventional HEMT structure that stands on the use of an GaN compound.
Figure 2B:
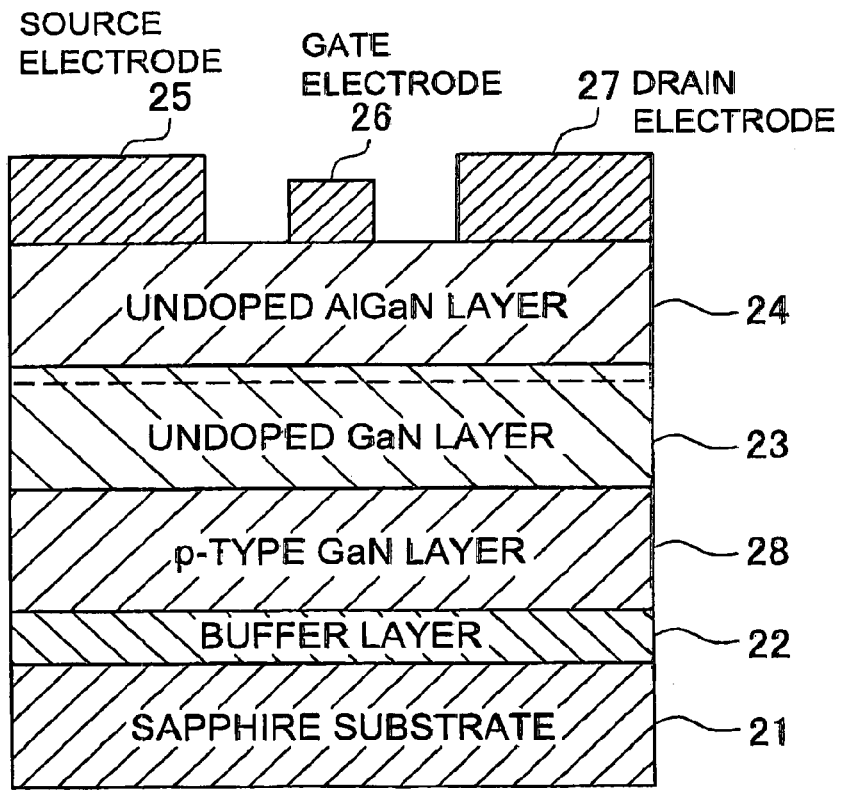
Figure 8A:
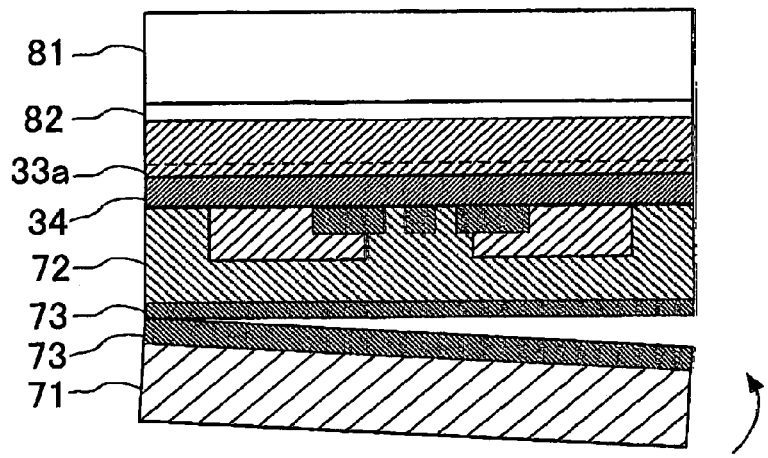
FIGS. 8A-8C are schematic sectional views illustrating a manufacturing step for the field effect transistor according to an embodiment of the present invention.
Figure 8B:
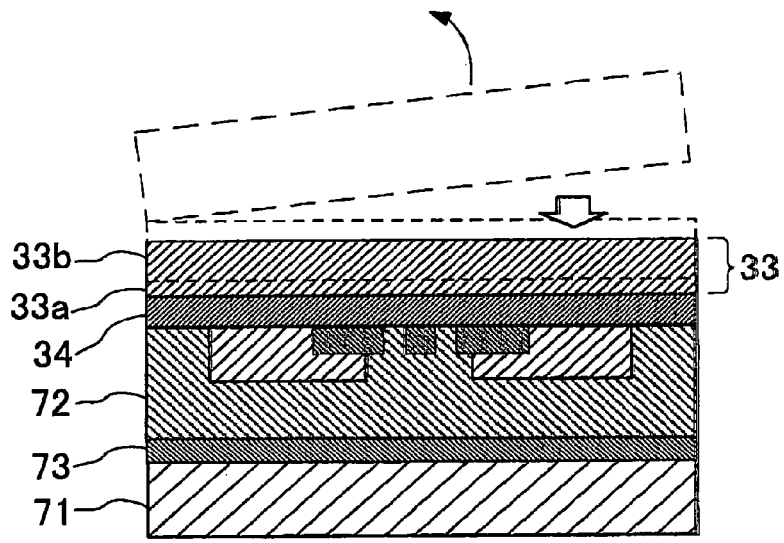
Figure 8C:
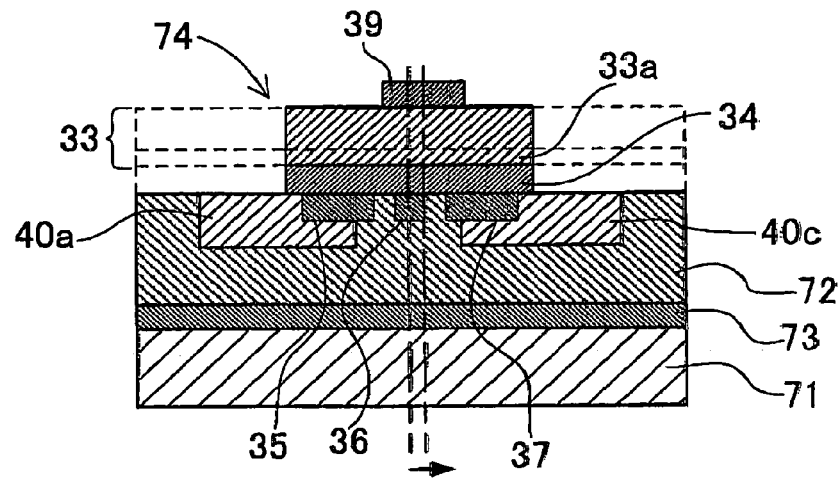

When applying a voltage to the HEMT having an electrode structure such as that illustrated in FIG. 1, an electric field that is higher than that which is applied in the other part is inconveniently applied at the drain terminal of the gate electrode. By applying a high voltage to the field effect transistor device and, as a result, the local field intensity exceeds a specified value. Thus, breakdown of the device occurs at that place. Accordingly, when it is desired to increase the withstand voltage of the device, it is important to avoid the concentration of the electric field. In the embodiment, by adding a second electrode, an electric field is added, and thus the localized of the electric field is eased. This contributes to enhancing the withstand voltage of the field effect transistor device. To effectively exhibit that field-easing effect of the second electrode, it is preferable that the second electrode is located at a position of the back side of the device where the gate electrode opposes or its proximity. In addition, even when the second electrode is located almost at or close to the back side of the device where the gate electrode is positioned, it is preferable that the second electrode be shifted toward the drain electrode side from the position opposing the gate electrode. As a concrete example, the carriers, within the carrier transit layer, at the position extending from the center of the width of the gate electrode to the drain electrode side increase in terms of the collision ionization and hole occurrence during the transit of the carriers. Accordingly, it is preferable that this region be formed in such a manner as to cover the area between the gate electrode and the drain electrode. For example, as illustrated in FIG. 8C, the electrodes need only to be disposed so that the center portion of the width of the second electrode may be displaced in the direction of the transit with respect to the center portion of the gate electrode. A one-dot chain line of FIG. 8C indicates the center portion of the width of each of the gate electrode 36 and second electrode 39. As a result of this, it is possible to more effectively ease the electric field.

Figure 6:
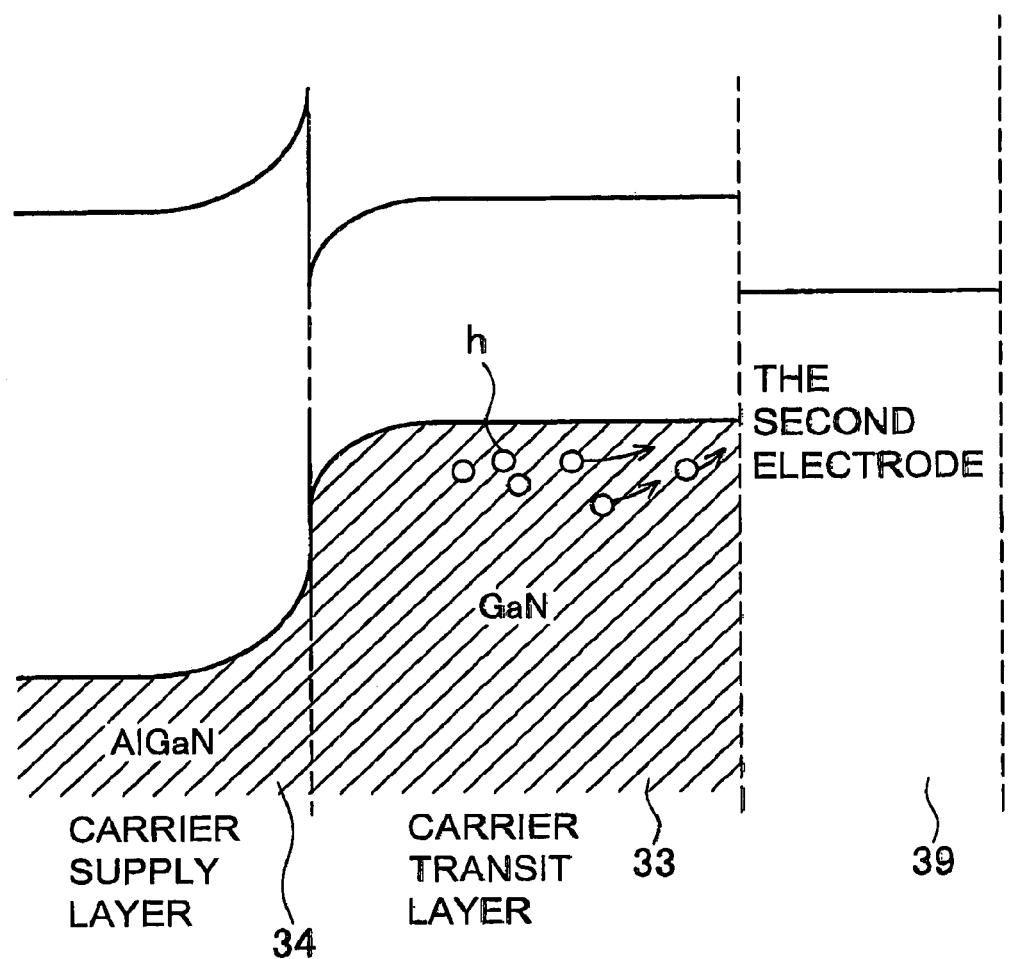
FIG. 6 is a band gap view illustrating a band gap between each layer in the structure of FIG. 3.

Preferably, in the second electrode 39, the material quality, film thickness, etc. are set so that it may form a Schottky contact with the carrier transit layer 33. If necessary, a contact layer, etc. may be interposed between the second electrode 39 and the carrier transit layer 33. In FIG. 6 there is illustrated a band gap view between each layer in the structure of FIG. 3. As illustrated in this figure, by forming a Schottky junction at the interface between the carrier transit layer 33 and the second electrode 39, the holes h that have occurred due to the collision ionization become able to be discharged from the field effect transistor device by way of the second electrode 39. Although the holes h can be exhausted even in the ohmic contact, the holes h can more easily be exhausted in the Schottky contact. As in the case of easing the electric field, it is preferable that the second electrode be located at a position that opposes the gate electrode almost at or close to the back side of the device. Furthermore, even when the second electrode is located almost at or close to the back side of the device, it is preferable that the second electrode be shifted toward the drain electrode side from the position opposing the gate electrode. Although the second electrode may be formed at the position opposing the source electrode or drain electrode, by providing the second electrode at a position spaced away from the position that opposes the gate electrode almost at or close to the back side of the device, the holes have difficulty in moving. In addition, extreme difficulty is encountered in obtaining the effect of discharging the holes.

The GaN-based HEMT is constructed using a gallium nitride-based compound semiconductor. According to the necessity, on the substrate there is formed a buffer layer. Further, the carrier transit layer 33 and carrier supply layer 34 are sequentially epitaxially grown. Further, the electrodes are laminated. As the method for crystal growth, it is possible to use, for example, an MOCVD (metal-organic chemical vapor deposition), HVPE (hydride vapor phase epitaxy), MBE (molecularbeam epitaxy), etc. The gallium nitride-based compound semiconductor is expressed by a general formula of $In_xAl_yGa_{1-x-y}N$ ($0 \leq x, 0 \leq y$, and $x+y \leq 1$). To this semiconductor there may be added B, P, or As as a mixed crystal. Also, in the specification of the invention of this application, the n-type nitride semiconductor layer and p-type nitride semiconductor layer are each not particularly limited, namely, may each be used as a monolayer or as a multilayer structure. Also, an n-type impurity and p-type impurity are suitably contained in the nitride semiconductor layer. As the n-type impurity, it is possible to use the elements belonging to the IV group that includes Si, Ge, Sn, S, O, Ti, and Zr, or the VI group. Preferably, there can be used Si, Ge, and Sn. As the most preferable elements, it is possible to use Si. Also, as the p-type impurity, although not particularly limited, there can be taken up, as an example, Be, Zn, Mn, Cr, Mg, Ca, and such. Preferably, Mg is used. By using these impurities, it is possible to form respective conductivity types of nitride semiconductor. Regarding the substrate, it is possible to use a conductive substrate such as GaN substrate or SiC substrate, or the like, which the thermal conduction of that is high and the heat dissipation property of that is excellent. Insulating substrate such as sapphire substrate may also be employed.

Each of the electrodes such as the source electrode 35, gate electrode 36, or drain electrode 37 is formed using composition ingredients typically different from those used to form the semiconductor materials constructing the device. For example, it is constructed using the material having excellent electric conductivity such as Ti, Al, Cu, W, Au, Ag, Mo, Ni, Pt, In, Rh, Ir, and Cr. Also, the relevant material is not limited to metallic materials, and electrically conductive oxides, electrically conductive plastics materials having electric conductivity, etc. can also be used. Further, regarding the electrode, it can be constructed using not only single-elemental material but also a multi-elemental material such as alloyed material, eutectic material, and mixed crystal. For example an ITO, etc. can be used. Furthermore, a structure having more than one layer can also be adopted. Preferably, as the ohmic electrode appropriate for the AlGaN or GaN semiconductor layer, a Ti/Al electrode can be adopted, while, as the Schottky electrode, there is adopted an electrode formed using a Ni/Au material. As a result of this, the ohmic characteristic, Schottky characteristic, etc. which are demanded as the electrode for HEMT use excellently function. For example, for obtaining the ohmic contact for the source electrode, as well as for obtaining that contact for the drain electrode, Ti/Pt, Ti/Au, and Ti/Al based metals are used and, at this time, quick annealing is performed at 800° C. to 950° C. Also, for the gate electrode, Ni/Au, TiN, Ti/Pd/Au, W/Au, etc. are used. Regarding the shape of the electrode, although it is not particularly limited to a T-shape, I-shape, etc., by shaping into the T-shaped gate electrode, it causes the increase in the sectional area of the electrode to enable decreasing the electric resistance. Accordingly, it is further preferable in terms of the improvement in the high frequency characteristic of the operating frequency. Also, taking the adhesion, etc. between the ohmic electrode and the wire line, a pad electrode may be formed at the surface of contact with the semiconductor layer. On the pad electrode, there is formed a metallized layer (bump) for connection to an external electrode, etc. The metallized layer is formed using material such as Ag, Au, Sn, In, Bi, Cu, and Zn. The electrode formation surface side of the field effect transistor is made to oppose external electrodes provided on a sub-mount, then the two electrodes are joined together by the bump through the use of the bump. Further, wiring etc. is performed on the sub-mount. Also, as the sub-mount, an electrically conductive substrate may be used, and the electrodes may be electrically connected to the substrate so that electric current may be taken out. As the electrode connected to the substrate, use of the source electrode is preferable. It is to be noted that, in the specification of the invention of this application, the terminology of, for example, Ti/Al indicates a structure in which Ti and Al are sequentially laminated from the semiconductor side.

The substrate and buffer layer are preferably removed. Due to the existence of the buffer layer the leak current occurs and, as a result, a leak path is formed. Accordingly, the formation of this leak path can be prevented by removing the buffer layer. Also, the buffer layer, underlying layer, etc. at an early stage of the growth have the tendency of becoming inferior in crystallinity. In that case, because that portion serves as the leak path, it is preferable that the layers be removed at a level below which crystallinity is inferior so that the first semiconductor layer and second semiconductor layer may be formed. Regarding the substrate, when an entire substrate is removed, removal of the buffer layer and formation of the second electrode become easy. It is also possible to remove only a part of the substrate and cause exposure of the semiconductor layer and form the second electrode on the exposed part. At this time, since the hole-discharging function and characteristic can be varied according to the thickness of the first semiconductor layer in the elemental structure, i.e., the carrier transit layer, it is possible to adjust to a desired value of film thickness.

Figure 7A:
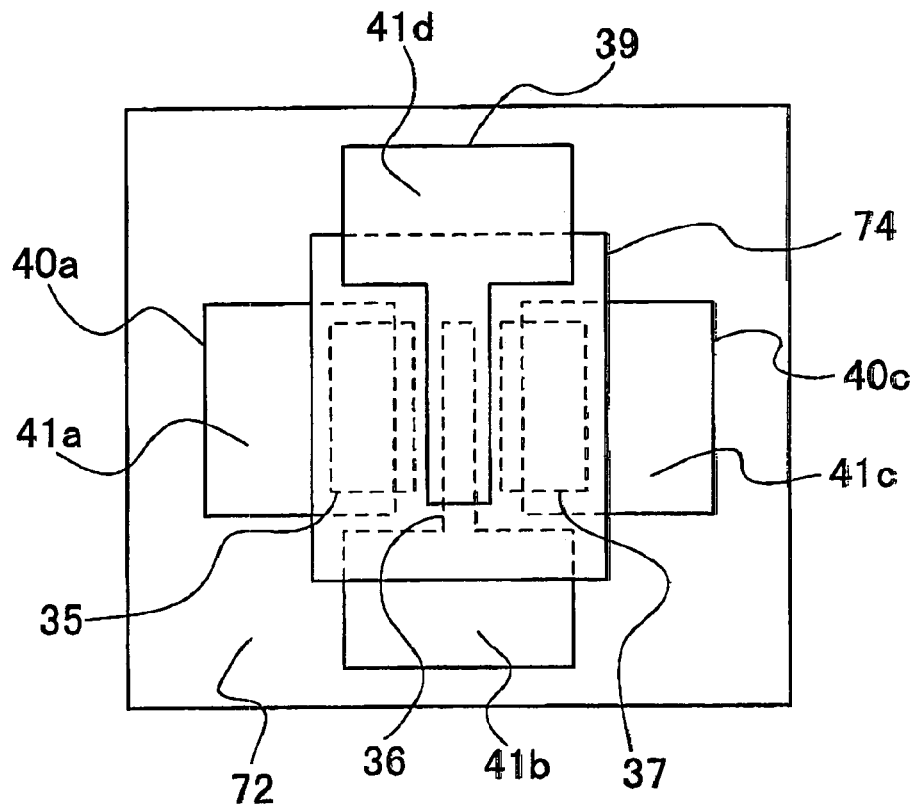
FIG. 7A is a schematic plan view bonding the field effect transistor illustrated in FIG. 3 onto a support substrate.
Figure 7B:
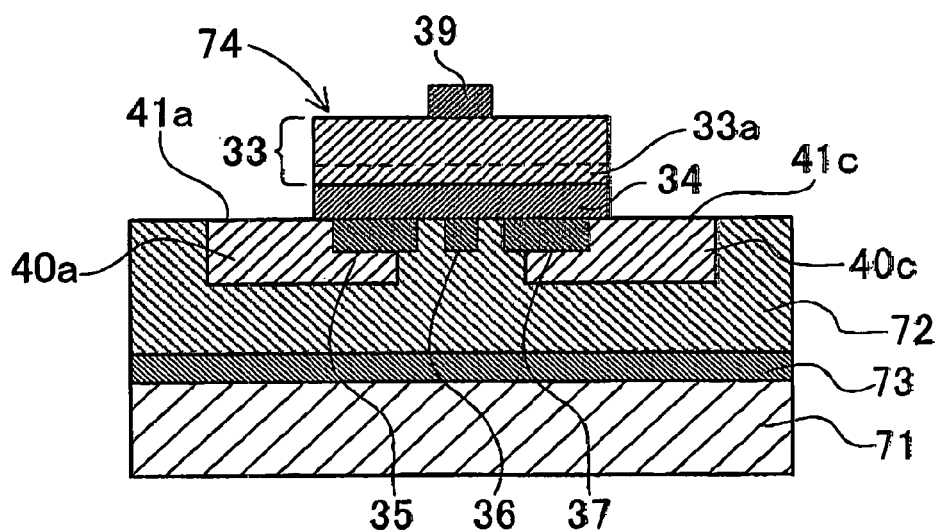
FIG. 7B is a schematic sectional view bonding the field effect transistor illustrated in FIG. 3 onto a support substrate.

A method of manufacturing a field effect transistor according to the embodiment will now be described. The field effect transistor, for example, shown in FIG. 7A and FIG. 7B, is manufactured as follows. FIG. 7A and FIG. 7B are schematic views taken in a case where the field effect transistor of FIG. 3 is bonded, or glued, to a support substrate. FIG. 7A is a schematic plan view, and FIG. 7B is a schematic sectional view. Also, FIGS. 8A to 8C are schematic sectional views illustrating the manufacturing steps for the field effect transistor of FIGS. 7A and 7B. Here, with the MOCVD, the GaN-based HEMT is fabricated on the sapphire substrate. First, the sapphire substrate is set in an MOCVD reactor as a growth substrate 81. Then, a substrate surface which is a C-plane of the sapphire substrate 81 is heated, within an atmosphere of hydrogen and, by doing so, the temperature of the substrate is elevated up to 1050° C. and, while hydrogen is being caused to flow, cleaning of the substrate 81 is performed. Subsequently, the temperature of the substrate is lowered down to 510° C. Then, by using hydrogen as the carrier gas and by using as source gases a TMG (trimethyl gallium) and ammonium gas, the buffer layer 82 consisting of GaN is grown on the substrate 81 to a film thickness of approximately 200 Å. After the buffer layer 82 is grown, in subsequence, only the TMG (trimethyl gallium) is stopped and the temperature of the substrate is elevated up to 1050° C. When the temperature of the substrate has increased up to 1050° C., by, similarly, using the TMG and ammonium gasses as source gases, an undoped GaN layer is grown with a film thickness of 3 μm GaN layer. This undoped GaN layer acts as the carrier transit layer 33. Incidentally, the layer that is represented by the terminology "the undoped" means the one the impurity concentration of that is $1 \times 10^{17}/cm^3$ or less.

Next, with the temperature of the substrate at 1050° C., using as source gases the TMG gas, TMA (trimethyl aluminium) gas, and ammonium gas, an undoped AlGaN layer made of $Al_{0.2}Ga_{0.8}N$ the mole fraction Al ratio of which is 0.2 is grown to a film thickness of 50 Å. In subsequence, with the temperature of the substrate kept at 1050° C., by using the TMG, TMA, and ammonium gases as source gases and by using a silane gas as the impurity gas, there is grown to a film thickness of approximately 100 Å an n-type AlGaN layer that is doped with Si by $2 \times 10^{18}/cm^3$ and is made of $Al_{0.2}Ga_{0.8}N$ the mole fraction Al ratio of which is 0.2. This Si-doped n-type $Al_{0.2}Ga_{0.8}N$ layer acts as the carrier supply layer 34. After completion of the reaction, the temperature is lowered down to room temperature, then the wafer is taken out from the reactor. Incidentally, while, as have up to now been explained, in this embodiment, the undoped GaN, undoped AlGaN, and n-type AlGaN are provided sequentially from the substrate, for brevity of the explanation no illustration is made of the undoped AlGaN. Incidentally, by providing the undoped AlGaN, it is possible to make higher electron mobility in the channel.

(Photolithography Step)

First, for insulating the part other than the element-formation region, using a spin coater a resist is coated. After this, exposure of the pattern is performed to pattern the resist. Then, for the purpose of, using a plasma RIE device, etching each of the AlGaN layer and GaN layer as the elemental isolation, etching is performed, with a $Cl_2$ gas, using an ICP etching device. And, the source electrode 35 and drain electrode 37 are formed in such a manner as Ti and Al are treated, each, using a magnetron sputter device. By this, the Ti is sputtered to 100 Å and the Al is sputtered, with 500 W, to 3000 Å. After that, lift-off is done. After that, the electrodes are annealed for 10 minutes at 600° C. in an atmosphere of nitrogen gas.

The pad electrodes 40a and 40c provided on the source electrode 35 and drain electrode 37 for external connection and gate electrode 36, are separately patterned. As the gate electrode 36, Ni is sputtered to 2000 Å and is lifted off. Then, further, photolithographing is done. Further, as the pad electrode 40a and 40c, the Ni is sputtered to 2000 Å and then is lifted off. Over the entire surface, the insulating protective films 72, $SiN/SiO_2$ are formed to 1000/20000 Å. Next, as the metal materials for the adhesion layer 73, Ti/Pt/Au/Sn/Au are sputtered over the entire surface. As illustrated in FIG. 8A, the mass prepared by sputtering Ti/Pt/Au to the support substrate 71 Cu—W for lamination is press bonded to the above-described Ti/Pt/Au/Sn/Au surface.

In order to expose the carrier transit layer 33 made of the undoped GaN, the sapphire substrate 81 is removed through the laser lift-off operation and the buffer layer 82 and part of the underlying layer are removed by polishing, as illustrated in FIG. 8B. Then the resist is pattered to the carrier transit layer 33 that has been exposed and, partially removing the elementary structure as illustrated in FIG. 8C, using the ICP etching, part of the gate electrode 36 which doubles as the pad electrode and the pad electrode 40a and 40c are exposed to made a external-connection portion 41a, 41c and 41d, shown in FIG. 7A. The external-connection portion 41a, 41c and 41d is exposed so that, in the side surfaces of the elemental structure that has been fabricated, the exposed portions may be extended from the component sides that are individually different from one another. By making up into this structure, it becomes a type wherein the external-connection portion 41a, 41c and 41d of each electrode can be spatially separated apart from each other; the wires distributed from the electrode are not short-circuited; and electric discharge between the wires can be prevented. On the other hand, each electrode may be exposed so that two or more of the electrodes may be extended from the same composing side and direction. By disposing the gate electrode 36 and the external-connection portion of the second electrode 39 so that they may be extended from the same composing side and be overlapped with each other, they can be connected to each other by means of, for example, a metal layer, and thus electric connection between these becomes easy. After the performance of the etching, it is also possible to form a protective film on the exposed surface of the elemental structure 74. On the surface of the carrier transit layer 33 that opposes the gate electrode 36, a Ni Schottky electrode is formed as the second electrode 39. In FIG. 8C, the center portion in widthwise direction of the second electrode 39 is displaced, to the drain electrode 37 side along the direction of transit, when it is viewed with respect to the center portion of the gate electrode 36.

(Elemental Structure)

Figure 9A:
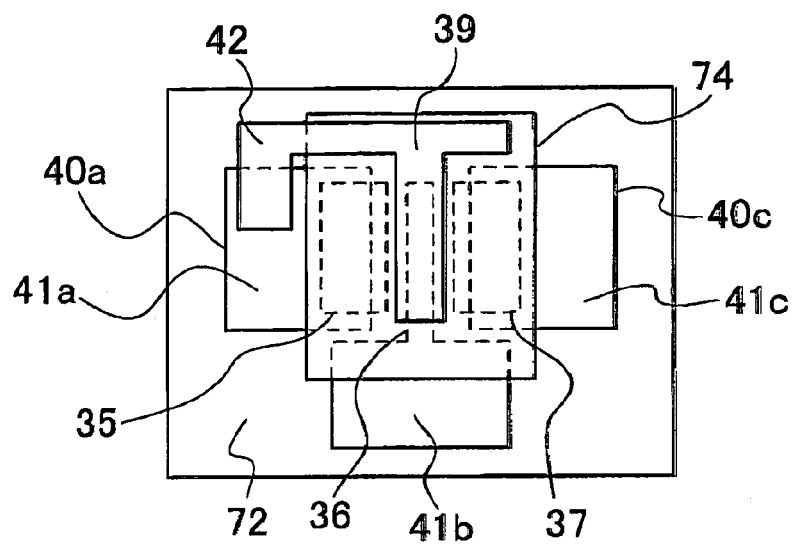
FIGS. 9A-9B are schematic plan views illustrating an example of the field effect transistor according to an embodiment of the present invention.
Figure 9B:
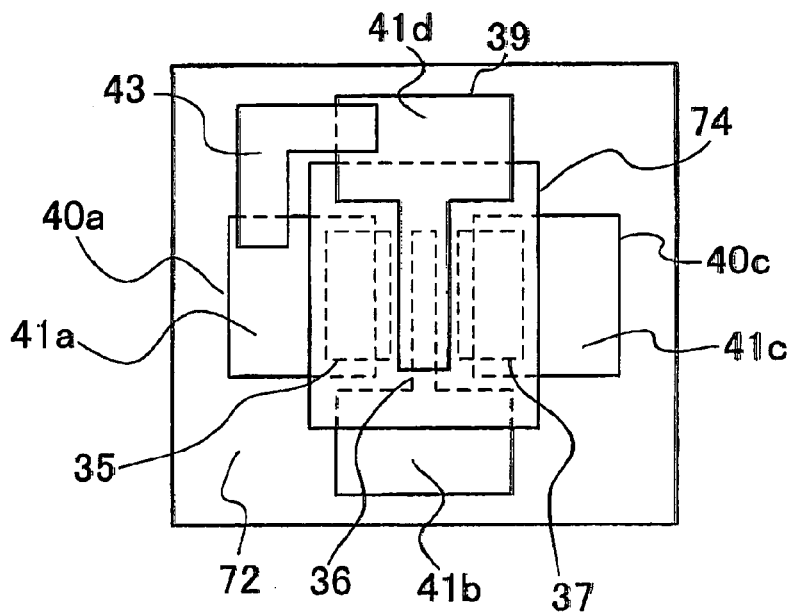
Figure 9C:
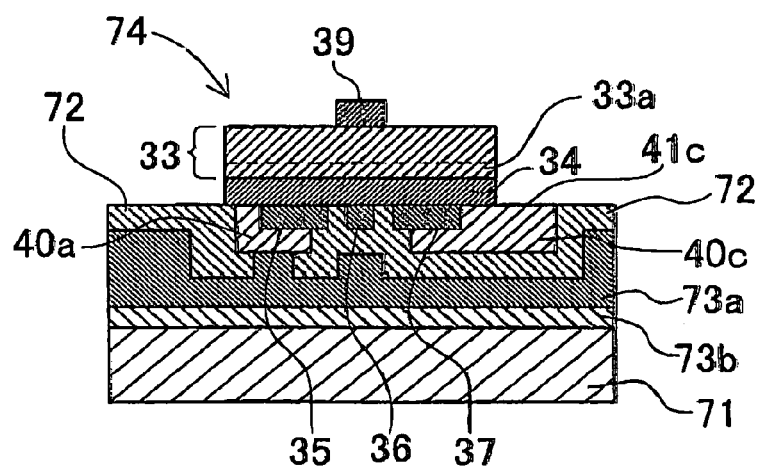
FIG. 9C is a schematic sectional view illustrating an example of the field effect transistor according to an embodiment of the present invention.

In this way, the elemental structure and electrode structure formed adhered to the support substrate can be made up into a structure such as that illustrated in the plan view of FIG. 7A and in the sectional view of FIG. 7B. Namely, as the sectional structure, on the principal surface side of the elemental structure there are provided, as the primary electrode, the source, gate, and drain electrodes, while, on the other hand, on the other principal surface, as the secondary electrode, there is provided the second electrode, and thus a structure is prepared in which the electrodes on the primary electrode side are adhered to the support substrate 71 via the insulating film 72 and the contact layer 73. As a result of this, the structure is made up into the one in which, as illustrated in FIG. 7B, the external-connection portions 41a and 41c for primary electrode is embedded in the insulating film 72, and thus, the external-connection portions 41a and 41c are formed in a state of their being isolated from each other. Also, the secondary electrode side and the second electrode are formed in such a manner as to extend on the insulating film 72, and thus, the structure is prepared in which the primary and secondary electrode are disposed on the insulating film 72. In a case where the support substrate is made of an electrically conductive substrate, the insulating film can be formed only on a specific electrode and the electrode is conducted to the support substrate without forming insulating film, and the electrode can be taken out from the support substrate side. As the electrode that is to be taken out from the support substrate, the source electrode is preferable. For example, as illustrated in FIG. 9C, by electrically connecting the pad electrode 40a of the source electrode 35 to an electrically conductive adhesion layer 73a, and connecting the electrically conductive adhesion layer 73b formed on the electrically conductive support substrate 71 and the adhesion layer 73a, the source electrode 35 can be taken out from the support substrate 71 side. In this case, the pad electrode 40a for the source electrode 35 is not exposed from the elemental structure, and the external-connection portion is not formed. The second electrode can be also disposed in such a manner as to overlap upon the source electrode and gate electrode that oppose with the elemental structure 74 in between and be also connected to it in that manner. For example, as illustrated in FIG. 9A, the second electrode 39 may be formed so as to have an electrode-connection portion 42 overlapping with the external-connection portion 41a of the source electrode 35 and, by means of the electrode-connection portion 42, the second electrode 39 needs only to be electrically connected to the source electrode 35. Further, as shown in FIG. 9B, the second electrode 39 and source electrode 35 may be connected using interconnect metal 43. Here, while the primary electrode and the secondary electrode are disposed so as to oppose each other with the elemental structure 74 in between, because it suffices that on each electrode there are provided the gate electrode and the second electrode, as the other electrode there may be used the primary electrode previously described, or, in addition, there may also be used the secondary electrode. Also, since the secondary electrode enables monitoring the position of the primary electrode that is on an opposite side through the elemental structure, the electrode can be formed by adjusting that position. Especially, the positional relationship between the second electrode and either the source electrode or gate electrode of the embodiment can be established as desired. By applying this, it is possible to measure and evaluate the device characteristics resulting from the source, gate and drain electrodes of the primary electrode, and then, to adjust the position, width, area, and such of the second electrode of the secondary electrode for adjusting these characteristics, and to form the second electrode.

In the above-described elemental structure, although it was illustrated as an example wherein part of the elemental structure 74 is removed, a structure can be made up in which the elemental structure 74 is removed with its depth partly left as is and in the film thickness region, where that part is left as is, an opening for exposing the electrode is provided. For example, at the position that is deeper than the carrier transit layer 33, with its portion partly left as is the semiconductor layer is exposed, and part of this exposed portion is further removed to cause exposure of the electrode and this exposed portion is used as the portion of connection to the outside. In this case, an in-plane structure can be made up in which a interconnect metal, wherein the interconnect metal is distributed on the exposed portion of the semiconductor layer on an insulating film, is provided, and, on the exposed portion of the semiconductor layer, respective electrodes are disposed as described above. In this structure, compared with the structure illustrated in the relevant sheet of drawing, the manufacturing steps such as the removal step, on-the-exposed-portion insulating film formation step, etc. increase in number. As a result of this, the structure becomes the one that is inferior in terms of the insulation structure. Also, although in the example illustrated the pad electrode was exposed, the source, gate, and drain electrodes may be directly exposed. Also, by removing, together with part of the electrode and together with part of the elemental structure, the pad electrode portion located below the electrode, it is also possible to form the portion of connection to the outside. Preferably, the illustrated structure is made up from the standpoint of the electrode strength.

(Device-Driving Circuit)

In the FET of the embodiment, although it is possible to provide a connection circuit that uses a second electrode and in that the second electrode is directly connected to the gate electrode and source electrode, connecting to the source electrode is more preferable. For example, the source electrode may be connected to the ground and the ground and the second electrode need only to be connected together. To the second electrode means for applying a voltage may be provided. By applying a voltage to the second electrode, the discharge of the holes can be controlled. The circuit structure like this can also be made the one having a structure wherein elements such as a circuit, respective driving means, voltage-applying means, etc. have been integrated on the insulating film exposed from the elemental structure.

(Packaging)

After the device steps are finished, a chip is mounted on the package. Here, in a case where providing a wire, a wire bonder is used. By wire bonding, heat dissipation can be made from the electrode by way of the wire. Also, according to the variation in the length of the wire line, the inductance component can be adjusted, so that matching of the operation can be achieved. Accordingly, wire bonding is preferable. In the field effect transistor illustrated in FIGS. 7A and 7B, the external-connection portions 41a and 41c for the respective electrodes are oriented in the same side. Accordingly, regarding any of the electrodes, they can be connected from the second electrode 39 side, so that wire bonding can easily be carried out. On the other hand, in the case of wireless bonding, it is possible to separately provide a heat conductive substrate on the second electrode side as well, and thus it is possible to improve the heat dissipation property. Also, because the pad for performing the wire bonding becomes unneeded, this suits miniaturization of the device. In addition, there is also the merit that it is possible to decrease the inductance component resulting from the existence of the wire, and that it is possible to decrease the capacitance component between the wire lines, as well as the capacitance component between each semiconductor element and the main body of the semiconductor device.

INDUSTRIAL APPLICABILITY

The field effect transistor and a method of manufacturing the same, according to the present invention, can be utilized for, for example, the HEMT structure whose carrier transit layer has high electron mobility or a flip-chip type high mobility transistor that has a facedown structure.

As this invention may be embodied in several forms without departing from the spirit or essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims. This application is based on Application No. 2004-336516 filed in Japan on Nov. 19, 2004, and No. 2005-329267 filed in Japan on Nov. 14, 2005, the contents of which are incorporated hereinto by reference.

What is claimed is:

1. A field effect transistor comprising:
an i-type first semiconductor layer made of a gallium nitride-based compound semiconductor layer;
a second semiconductor layer made of a gallium nitride-based compound semiconductor layer, the second semiconductor layer being formed on the first semiconductor layer and having a band gap energy greater than that of the first semiconductor layer;
a gate electrode formed on the second semiconductor layer; and
a second electrode formed on the first semiconductor layer such that the first semiconductor layer and second semiconductor layer are interposed between the gate electrode and the second electrode.

2. A field effect transistor according to claim 1, wherein the second electrode is formed in such a manner as to cover a part of the first semiconductor layer.

3. A field effect transistor according to claim 1, wherein the second semiconductor layer has an AlGaN layer and the first semiconductor layer has a GaN layer.

4. A field effect transistor according to claim 1, wherein the first semiconductor layer is a carrier transit layer; and the second semiconductor layer is a carrier supply layer.

5. A field effect transistor according to claim 1, wherein the field effect transistor is an HEMT.

6. A field effect transistor comprising:
a carrier transit layer made of a gallium nitride-based compound semiconductor layer;
a carrier supply layer made of a gallium nitride-based compound semiconductor layer, the carrier supply layer being formed on the carrier transit layer and having a band gap energy greater than that of the carrier transit layer;
a gate electrode formed on the carrier supply layer;
a source electrode formed on the different area of the carrier supply layer other than the gate electrode;
a drain electrode formed on the different area of the carrier supply layer other than the gate electrode and source electrode and;
a second electrode formed on at least a part of the carrier transit layer such that the carrier transit layer and carrier supply layer are interposed between the gate electrode and the second electrode.

7. A field effect transistor according to claim 6, wherein the second electrode is formed at a position that substantially opposes a position at which the gate electrode is formed.

8. A field effect transistor comprising:
a nitride-based compound semiconductor layer having a channel;
a source electrode;
a gate electrode;
a drain electrode; and
a second electrode formed on the nitride-based compound semiconductor layer having the channel such that the gate electrode and the second electrode are formed opposing each other with the channel therebetween,
wherein the second electrode is subjected to Schottky junction.

9. A field effect transistor according to claim 8, wherein the second electrode discharges a carrier of a conductivity type different from that of a carrier injected from the source electrode.

10. A field effect transistor according to claim 8,
wherein the field effect transistor has a laminate structure of a nitride-based compound semiconductor having the channel and
wherein the source electrode, gate electrode, drain electrode, and second electrode are provided on a surface of the laminate structure, each having an external connecting portion that extends outside from the laminate structure.

11. A field effect transistor according to claim 8, wherein a center axis in the vertical sectional view of the second electrode is displaced in a transit direction of the carriers in the channel, with respect to a center axis in the vertical sectional view of the gate electrode.

12. A field effect transistor according to claim 11, wherein the second electrode is formed partially on the nitride-based compound semiconductor layer.

13. A field effect transistor according to claim 8, wherein the field effect transistor is an HEMT having a heterojunction of a nitride-based compound semiconductor between the channel and the gate electrode.

14. A field effect transistor comprising:
a nitride-based compound semiconductor layer having a channel;
a source electrode;
a gate electrode;
a drain electrode; and
a second electrode formed on the nitride-based compound semiconductor layer having the channel such that the gate electrode and the second electrode are formed opposing each other with the channel therebetween,
wherein the second electrode is formed partially on the nitride-based compound semiconductor layer.

* * * * *